United States Patent [19]

Varshney et al.

[11] 4,354,257

[45] Oct. 12, 1982

[54] SENSE AMPLIFIER FOR CCD MEMORY

[75] Inventors: Ramesh C. Varshney; Kalyanasundaram Venkateswaran, both of San Jose, Calif.

[73] Assignee: Fairchild Camera and Instrument Corporation, Mountain View, Calif.

[21] Appl. No.: 152,638

[22] Filed: May 23, 1980

[51] Int. Cl.³ .................... G11C 13/00; G11C 7/00
[52] U.S. Cl. ................................ 365/219; 365/230; 365/183
[58] Field of Search ............... 365/219, 220, 230, 183

[56] References Cited

U.S. PATENT DOCUMENTS 3,946,368  3/1976  Chou .................................. 365/183
4,165,541  8/1979  Varshney et al. .................. 365/219

Primary Examiner—Terrell W. Fears
Attorney, Agent, or Firm—Paul J. Winters; Michael J. Pollock; Warren M. Becker

[57] ABSTRACT

A sense amplifier for use with a charge coupled device in which capacitive coupled charge is employed with a flip-flop circuit to accelerate sense and readout. Operation of the amplifier is effected with two external clocks and two internally generated clocks.

10 Claims, 8 Drawing Figures

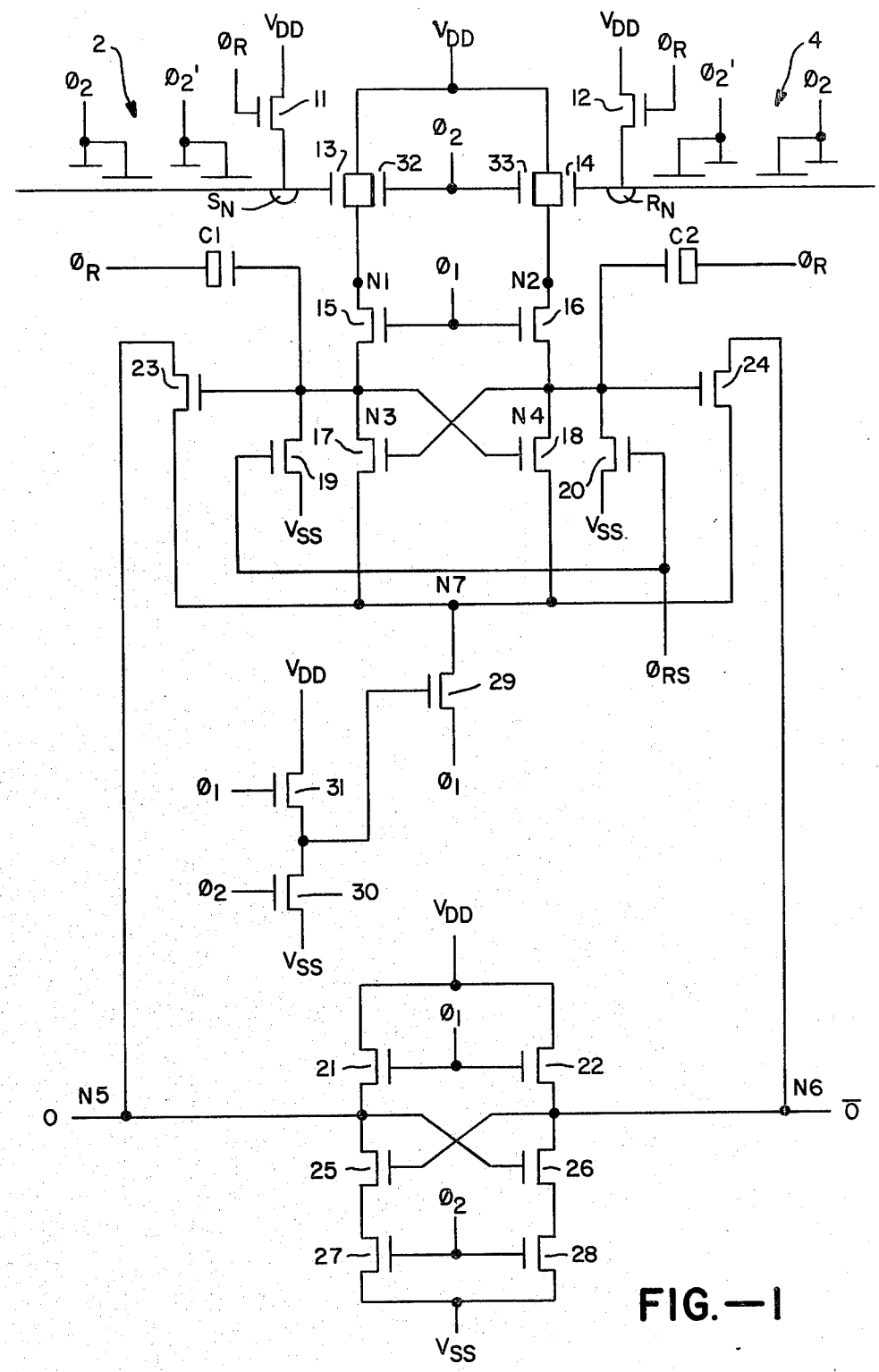
FIG.—1

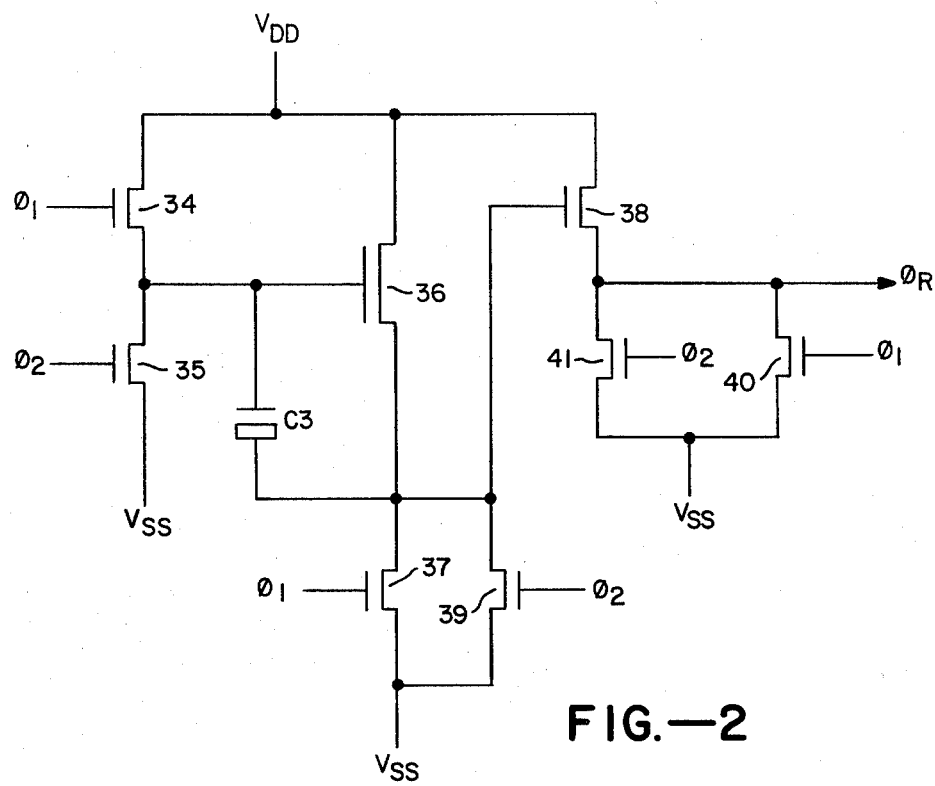
FIG.—2
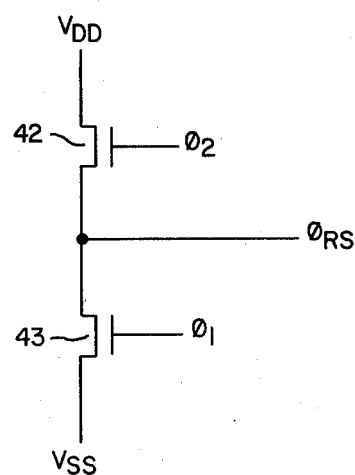
FIG.—3

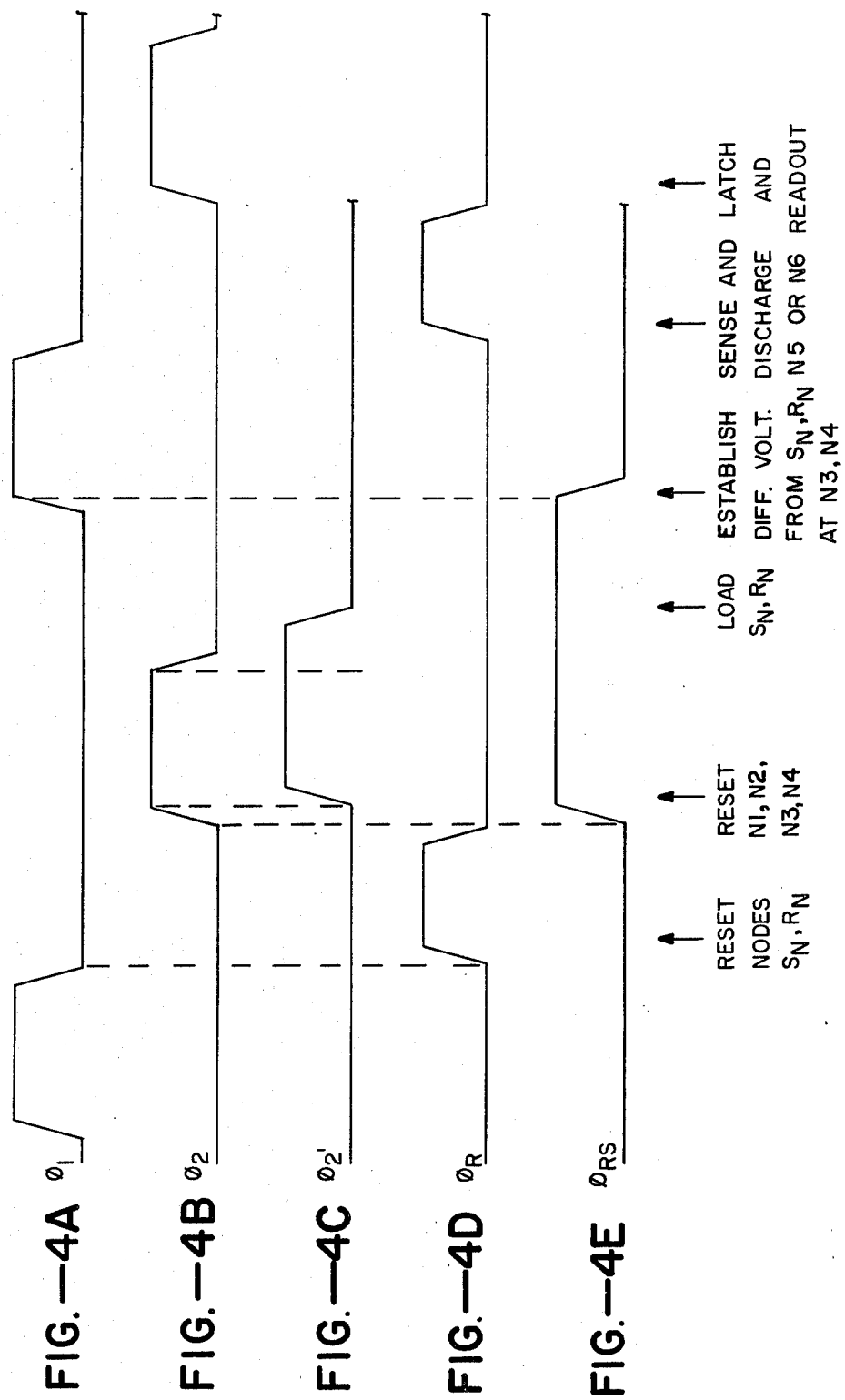

SENSE AMPLIFIER FOR CCD MEMORY

This invention relates generally to electronic memories employing charge coupled devices (CCDS), and more particularly the invention relates to charge sensing means for use with CCD memories.

A charge coupled device comprises a plurality of interconnected transfer electrodes which can produce a moving array of electric potential wells. In a memory application the voltage potential or charge in each well can denote a binary "1" or binary "0".

CCD memories and structures are well known in the art. For example, see Varshney et al., U.S. Pat. No. 4,165,541, assigned to the assignee of the present application. As disclosed in this patent, the memory is read by means of a sense amplifier which differentially compares the charge in a potential well and a reference voltage with a flip-flop of the amplifier responding to the differential of voltage on a sense node (indicative of the charge in the CCD potential well) and a reference node (indicative of the reference potential). Circuitry is known for generating a reference charge potential which is intermediate to a sense node charge potential indicating minimal charge (e.g. a binary "0") and a sense node charge potential indicating full charge (e.g. a binary "1"). The state of the flip-flop, in response to the sense node and reference node differential, is latched for readout in proper time sequence.

Speed of the sense amplifier depends on resetting the sense and reference nodes, receiving signal charge and reference charge, sensing the differential by means of a flip-flop, establishing voltage on readout terminals in response to the conductivity of the flip-flop, and latching the output terminals for readout. Adversely affecting this speed of operation are effectiveness of the flip-flop in establishing potentials on the output terminal and undesirable coupling through device overlay capacitance. Also, the dynamic voltage range of the sense and reference nodes and the speed of resetting these nodes greatly affects sense operation.

Accordingly, an object of the present invention is an improved sense amplifier for use with CCD memories.

Another object of the invention is a CCD memory sense amplifier with increased dynamic range.

Still another object of the invention is a sense amplifier with improved speed in operation.

Yet another object of the invention is a sense amplifier which allows high channel potential in a buried channel CCD structure.

A feature of the invention is the use of capacitive coupled amplification with the flip-flop in establishing voltage potentials on the output terminals.

Another feature of the invention is the use of depletion mode field effect transistors for resetting the sense and reference nodes of the amplifier prior to resetting the comparator.

Another feature of the invention is a comparator clamp which allows the output terminals to recharge prior to sensing the sense and reference node charge differential.

Yet another feature of the invention is latch means which minimizes noise on the output terminals during readout.

The invention and objects and features thereof will be more readily apparent from the following detailed description and appended claims with the drawing, in which:

FIG. 1 is an electrical schematic of one embodiment of the sense amplifier in accordance with the present invention.

FIG. 2 is an electrical schematic of a circuit for generating a control signal for use in the circuit of FIG. 1.

FIG. 3 is an electrical schematic of a circuit for generating another control signal for use in the circuit of FIG. 1.

FIGS. 4A–4E illustrate control signals used in the operation of the amplifier of FIG. 1.

Referring now to the drawings, FIG. 1 is an electrical schematic of one embodiment of a sense amplifier in accordance with the invention. The amplifier operates in response to two external clock signals, $\phi_1$ and $\phi_2$, and two internally generated clock signals $\phi_R$ and $\phi_{RS}$. In this embodiment the amplifier operates from a plus voltage potential, $V_{DD}$, and ground voltage potential, $V_{SS}$. All transistors are enhancement mode field effect transistors except as otherwise specifically noted.

The amplifier senses and responds to voltage on a sense node, $S_N$, and a reference node, $R_N$, in a charge coupled device. As heretofore indicated, such charge coupled devices are conventional and include a plurality of electrodes such as electrodes 2 and 4 which transfer charge to the sense node and reference node, respectively, in response to clock signals $\phi_2$ and $\phi_2'$. Typically, the presence of charge in a potential well signifies a binary "1", and the absence of charge in a potential well designates a binary "0".

The amplifier includes first and second transistors 11 and 12 which are interconnected between the positive potential, $V_{DD}$, and the sense and reference nodes to periodically precharge the nodes in response to a reset signal, $\phi_R$.

The voltages on the sense node, $S_N$, and the reference node, $R_N$, respectively control the conductance of transistors 13 and 14. Transistor 13 is serially connected with transistors 15 and 17, with the common node of transistors 13 and 15 designated N1, and the common node of transistors 15 and 17 designated N3. Transistor 14 is serially connected with transistors 16 and 18 with the common node of transistors 14 and 16 designated N2 and the common node of transistors 16 and 18 designated N4. Transistors 17 and 18 are cross-coupled between drain and gate and function as a flip-flop or differential amplifier in response to charge on the sense node and reference node, as will be described hereinbelow. The sources of transistors 17 and 18 are connected together at a node designated N7.

Node N3 is connected to $V_{SS}$ through transistor 19, and node N4 is connected to $V_{SS}$ through transistor 20. The gates of transistors 19 and 20 are controlled by a control signal $\phi_{RS}$.

Transistors 21 and 23 are serially connected between $V_{DD}$ and node N7, and the common terminal (or node) N5 of transistors 21 and 23 comprises a first amplifier output, O. Transistors 22 and 24 are serially connected between $V_{DD}$ and node N7 with the common terminal (or node) N6 of transistors 22 and 24 comprising a second amplifier output, $\overline{O}$. The gates of transistors 15, 16, 21, and 22 are controlled by signal $\phi_1$, and the gates of transistors 23 and 24 are controlled by the voltage on nodes N3 and N4, respectively, of the flip-flop.

As will be described further hereinbelow in accordance with one feature of the invention capacitors C1 and C2, respectively, are connected to the gate electrodes of transistors 23 and 24, respectively, with one electrode of each capacitors being connected to a control signal, $\phi_R$, to periodically bolster the voltages on nodes N3 and N4.

In accordance with another feature of the invention, transistors 25–28 comprise a latch for preventing noise on the outputs O and $\overline{O}$ during readout. Transistors 25 and 27 are serially connected between the O output and $V_{SS}$, and transistors 26 and 28 are serially connected between output $\overline{O}$ and $V_{SS}$. The drain and gate electrodes of transistors 25 and 26 are cross coupled, and the gate electrodes of transistors 27 and 28 are controlled by the control signal $\phi_2$.

Transistor 29 is serially connected between node N7 and the control signal $\phi_1$, with the gate electrode of transistor 29 being controlled by the voltage on the common terminal of serially connected transistors 30 and 31 which are interconnected between $V_{DD}$ and $V_{SS}$. The gate of transistor 30 is controlled by signal $\phi_2$, and the gate of transistor 31 is controlled by the signal $\phi_1$.

Also serially connected between $V_{DD}$ and nodes $N_1$ and $N_2$ are depletion mode transistors 32 and 33, respectively, with the gate electrodes of transistors 32 and 33 being controlled by signal $\phi_2$.

Operation of the amplifier of FIG. 1 will be described with reference to the control signals $\phi_1$, and $\phi_2$, and the internally generated control signals $\phi_R$ and $\phi_{RS}$, which are illustrated in FIG. 4. Circuitry for generating the signal $\phi_R$ from the external signals $\phi_1$ and $\phi_2$ is illustrated in FIG. 2, and the circuitry for generating the signal $\phi_{RS}$ from the external signals $\phi_1$ and $\phi_2$ is illustrated in FIG. 3. Prior to discussing the operation of the amplifier of FIG. 1, the circuitry of FIGS. 2 and 3 will be briefly described.

As noted from FIG. 4, $\phi_R$ is generated during the underlap of signals $\phi_1$ and $\phi_2$. Turning to FIG. 2 transistors 34 and 35 are serially connected between $V_{DD}$ and $V_{SS}$ with signals $\phi_1$ and $\phi_2$ controlling the gates of transistors 34 and 35, respectively. Similarly, transistors 36 and 37 are serially connected between $V_{DD}$ and $V_{SS}$ with the gate of transistor 36 controlled by the voltage on the common terminal of transistors 34 and 35, and transistor 37 being controlled by $\phi_1$. The gate of transistor 36 is coupled through capacitor C3 to the common terminal of transistors 36 and 37. Transistor 38 is serially connected between $V_{DD}$ and the output $\phi_R$, with the gate of transistor 38 being controlled by the common terminal of transistors 36 and 37. Transistor 39 is connected in parallel with transistor 37 and is controlled by $\phi_2$. Parallel transistors 40 and 41 are connected between $\phi_R$ and $V_{SS}$ with the transistors controlled by $\phi_1$ and $\phi_2$, respectively.

Thus transistors 40 and 41 hold $\phi_R$ to a low voltage level $V_{SS}$ when either $\phi_1$ or $\phi_2$ is positive, and the circuitry comprising transistors 34–39 allows $\phi_R$ to rise to a positive voltage level during the underlap of $\phi_1$ and $\phi_2$.

In FIG. 3 transistors 42 and 43 are serially connected between $V_{DD}$ and $V_{SS}$ and are controlled respectively by $\phi_2$ and $\phi_1$ whereby $\phi_{RS}$ is at a positive voltage level upon the conduction of transistor 42 in response to $\phi_2$ and goes to a low voltage level in response to the conduction of transistor 43. Transistor 43 is a high threshold device thus delaying the conduction of transistor 43 until the signal $\phi_1$ approaches its maximum value.

Consider now the operation of the amplifier of FIG. 1 with reference to the control signals of FIG. 4. The sense and reference nodes are precharged to $V_{DD}$ through transistors 11 and 12 by the internally generated clock $\phi_R$ during the underlap of signals $\phi_1$ and $\phi_2$. During $\phi_2$, nodes N1 and N2 are precharged high to $V_{DD}$ through transistors 32 and 33, and nodes N3 and N4 are discharged low to $V_{SS}$ through transistors 19 and 20. By presetting these nodes any pattern sensitivity in the device is avoided.

Charge is then transferred to the sense and reference nodes by the trailing edge of the delayed $\phi_2$ clock signal, $\phi_2'$, thereby developing a differential voltage on the sense and reference nodes proportional to the charge differential.

Thereafter, when $\phi_1$ goes high, the voltages on nodes N1 and N3 are established by the charge on Sn and the voltages on nodes N2 and N4 are established by the charge on Rn, thereby establishing the differential voltage on nodes N3 and N4 corresponding to the differential voltage developed on the sense node and reference node. Importantly, nodes N3 and N4 are kept low during the initial few nanoseconds of the $\phi_1$ clock time by transistors 19 and 20 due to the delay in the clock $\phi_{RS}$ going low. This time allows the output nodes N5 and N6 to be precharged high through transistors 21 and 22, respectively. Additionally, node N7 is precharged high during the $\phi_1$ phase.

Sensing of the voltage differential is initiated by the falling edge of $\phi_1$ when node N7 discharges through conductive transistor 29. Assuming that node N3 is at a higher voltage potential than node N4 (due to a lack of charge in the CCD potential well applied to the sense node) transistor 18 will conduct initially thereby discharging node N4 and thus increasing the voltage difference across transistors 17 and 18. Assuming that node N7 discharges slower than the time taken to discharge node N4, the voltage on node N3 will stay high. However, if node N7 discharges faster than the discharge of node N4, node N3 will also discharge initially until node N4 is discharged below the threshold voltage of transistor 17 with respect to node N7.

The discharge of node N3 is unwanted as this will decrease the speed of discharge of the output node, N5, through transistor 23. In accordance with one feature of the invention capacitors C1 and C2 are connected to nodes N3 and N4, respectively, with the clock signal $\phi_R$ coupled to node N3 and node N4. The capacitively coupled $\phi_R$ voltage is more effective with respect to the high voltage level node (e.g. N3) thus promoting the discharge of the O output node N5 without affecting the voltage at the $\overline{O}$ output node N6.

The O output node N5 discharges through transistors 23 and 24 until the occurrence of $\phi_2$ which biases transistor 29 off. With the rise of $\phi_2$, the voltages on the output terminals N5 and N6 are latched by the cross coupled latch circuit comprising transistors 25–28. Thus, during the $\phi_2$ clock the output terminals can be read with the latch circuit preventing any noise on the output nodes. During $\phi_2$, nodes N1 and N2 are again precharged to $V_{DD}$ and nodes N3 and N4 are discharged low to $V_{SS}$ in preparation for the next sense cycle.

As hereinabove described, by using the capacitors C1 and C2 in combination with the differential flip-flop circuitry comprising transistors 17 and 18, the selective discharge of the output nodes is accelerated. The use of the latch circuitry with the output during readout prevents noise on the output nodes. Further, use of the depletion mode transistors 11 and 12 to reset the sense and reference nodes allows greater voltage margin on the reference and sense nodes and thus increases the dynamic range of the sense amplifier. Additionally, use of φ$_{RS}$ to reset the nodes N3 and N4 prevents any undesirable coupling to nodes N3 and N4 from output nodes N5 and N6 through the overlap capacitance of the transistors 23 and 24.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A sense amplifier for use with a charge coupled device having a sense node and a reference node comprising first means for setting said sense node and said reference node to a first voltage potential, second means for transferring a stored charge and a reference charge potential to said sense node and said reference node, respectively, differential voltage comparator means including cross-coupled transistors responsive to voltage on said node and said reference node whereby one of said transistors is rendered more conductive than the other of said transistors, first and second output voltage terminals, means for charging said output terminals, discharge means operably connected with said first and second output terminals and responsive to the conduction of said cross coupled transistors for selectively discharging one of said output terminals, and capacitive means coupled directly to said cross-coupled transistors and said discharge means for enhancing the selective discharge of one of said output terminals.

2. A sense amplifier as defined by claim 1 wherein said discharge means includes first and second discharge transistors coupled to said cross coupled transistors whereby the conductivity of said discharge transistors is controlled by the conductivity of said cross coupled transistors, and said capacitive means includes first and second capacitors interconnected with said discharge transistors whereby charge periodically applied to said capacitors is coupled to said discharge transistors to enhance the conduction of said discharge transistors.

3. A sense amplifier as defined by claim 1 and further including latch means including second cross coupled transistors coupled to said output terminals and responsive to a control signal to latch voltages on said output terminals during a voltage readout.

4. A sense amplifier as defined by claim 1 or 3 wherein said first means for setting said sense node and reference node comprises first and second depletion mode field effect transistors.

5. A sense amplifier as defined by claim 1 or 3 and including means for resetting said sense node and said reference node and means for resetting said comparator means, said sense node and said reference node being reset prior to resetting said comparator means.

6. A sense amplifier as defined by claim 5 and further including clamp means for clamping said first cross-coupled transistors until said output terminals are recharged.

7. A sense amplifier for use with a charge coupled device having a sense node and a reference node comprising first means for setting said sense node and said reference node to a first voltage potential, second means for transferring a stored charge and a reference charge potential to said sense node and said reference node, respectively, differential voltage comparator means including first cross coupled transistors responsive to voltage on said sense node and said reference node whereby one of said transistors is rendered more conductive than the other of said transistors, first and second output voltage terminals, means for periodically charging said output terminals, discharge means operably connected with said first and second output terminals and responsive to the conduction of said cross coupled transistors for selectively discharging one of said output terminals, and latch means including second cross coupled transistors coupled to said output terminals and responsive to a control signal to latch voltages on said output terminals during a voltage readout.

8. A sense amplifier as defined by claim 7 wherein said first means for setting said sense node and said reference node to a first voltage potential comprises first and second depletion mode field effect transistors.

9. A sense amplifier as defined by claim 7 or 8 and further including capacitive means associated with said discharge means for enhancing the selective discharge of one of said output terminals.

10. A sense amplifier as defined by claim 9 wherein said discharge means includes first and second discharge transistors coupled to said first cross coupled transistors whereby the conductivity of said discharge transistors is controlled by the conductivity of said first cross coupled transistors, and said capacitive means includes first and second capacitors interconnected with said discharge transistors whereby charge periodically applied to said capacitors is coupled to said discharge transistors to enhance the conduction of said discharge transistors.

* * * * *